United States Patent [19]

Aubert

[11] Patent Number: 4,748,429
[45] Date of Patent: May 31, 1988

[54] SOLENOIDAL MAGNET WITH HOMOGENEOUS MAGNETIC FIELD

[75] Inventor: Guy Aubert, Grenoble, France
[73] Assignee: Thomson-CGR, Paris, France
[21] Appl. No.: 905,316
[22] PCT Filed: Nov. 29, 1985
[86] PCT No.: PCT/FR85/00341
  § 371 Date: Aug. 13, 1986
  § 102(e) Date: Aug. 13, 1986
[87] PCT Pub. No.: WO86/03882
  PCT Pub. Date: Jul. 3, 1986

[30] Foreign Application Priority Data

Dec. 14, 1984 [FR] France ............... 8419191

[51] Int. Cl.$^4$ ............................................. H01F 5/00
[52] U.S. Cl. .................................. 335/299; 324/320; 335/300
[58] Field of Search ............... 335/299, 300; 324/318, 324/319, 320, 321

[56] References Cited

U.S. PATENT DOCUMENTS 4,490,675 12/1984 Knuettel et al. ............... 335/299 X
4,506,247 3/1985 Vermilyea ..................... 335/299 X

FOREIGN PATENT DOCUMENTS 59-36906 2/1984 Japan ........................... 335/300

Primary Examiner—George Harris
Attorney, Agent, or Firm—Oblon, Fisher, Spivak, McClelland & Maier

[57] ABSTRACT

A resistive solenoid magnet with homogeneous field is provided more particularly for NMR image formation.

According to the invention, the magnet comprises several coils preferably Bitter coils and some parameters such as the lengths of the coils, the distances which separate them and their outer diameter are chosen for optimizing the power-mass product of the magnet.

3 Claims, 2 Drawing Sheets

SOLENOIDAL MAGNET WITH HOMOGENEOUS MAGNETIC FIELD

BACKGROUND OF THE INVENTION

1. Field of the Invention

The invention relates to a solenoidal magnet for producing a relatively intense magnetic field with high homogeneity in a given region of space; the invention finds its privileged field of application in an installation for forming images by nuclear magnetic resonance (NMR) and also relates, by way of application, to such an installation including this coiled magnet.

2. Description of the Prior Art

An NMR image forming installation comprises, among other things:

a magnet capable of creating a relatively intense (of the order of 0.15 to 1.5 teslas) and uniform magnetic field in an examination volume sufficiently large for receiving the patient this magnetic field is called basic field;

an assembly of gradient coils generally arranged on the same cylindrical mandrel so as to be able to generate magnetic field gradients in predetermined directions in said examination volume, during successive sequences;

radio frequency transmission-reception means for energizing the spins of the atom nuclei for which the NMR conditions are united.

The magnet is traditionally a bulky and costly assembly. Up to present two different technologies have been mainly used. on the one hand magnets with resistive coils, without pole pieces and on the other magnets with super conducting windings.

Super conducting magnets raise numerous problems.

In this system, it is of prime importance to reduce the amount of cooling fluid (liquid helium) in thermal contact with the windings so as to keep them superconducting. For this, the geometry of the coils approximates a cylinder. It is in fact known that an infinitely long solenoid generates a uniform field in its internal space and that it is possible to homogenize the field inside a solenoid of finite length, for example by modifying the axial density of turns in the vicinity of its ends. However the space requirement of the different cryogenic (liquid nitrogen and liquid helium) systems is considerable and the useful volume inside the coils is considerably reduced. In other words, for a given axis, the diameter (and so the mass) of the windings is large. Furthermore, it is imperative to be able to cope with a failure of the cooling system. In fact, any heating above a few Kelvins results in the disappearance of the super conductivity phenomenon, and the current which flowed without voltage drop in the super conducting winding, disappears suddenly as soon as said winding becomes resistive. The magnetic field disappears also very rapidly and the flux variation which results therefrom may generate induction phenomena placing the life of the patient in danger. To cope with this eventuality, a conducting cylinder (generally made from aluminium) is disposed between the coils and the patient so that the energy released by variation of the flux is dissipated in the form of eddy currents in this cylinder. Besides the fact that this cylindrical casing further reduces the useful volume, all other things being equal, its presence considerably modifies the functioning of the gradient coils. Establishment of the gradients is in fact "delayed" at each sequence by the coupling between the gradient coils and this protective casing. To overcome this new disadvantage, the power supply sources for the gradient systems must be over dimensioned.

Magnets with resistive coils which are the most frequently used include two sets of coils distributed in pairs on each side of a median plane of the examination volume. These coils often have diameters such that they are spaced apart substantially over a sphere. This design comes from the fact that it is known that a winding of turns suitably coiled at the surface of a sphere produces a uniform field in this sphere. Since a system putting this concept exactly into practice would be unusable because access to the internal volume of the sphere would be impossible, systems have been constructed comprising such sets of coils of different diameters, spaced apart along a common axis and being inscribed substantially on a sphere, the homogeneity expressed in parts per million (ppm) being obtained in a sufficient volume of the sphere by adjusting different parameters such as the characteristics of the coils, their diameters and their positions along the axis. Such homogeneous field magnets, for another application than NMR image formation, have been calculated by Garrett and the results of these calculations were published in an article in the review "Journal of applied physics" in May 1967. However, these calculations related especially to the homogeneization of the magnetic field, without proposing a structure which is industrially easy to fabricate with relatively little raw material for a given electrical power, or vice versa. The invention provides first of all a solenoidal magnet with high magnetic field homogeneity having the additional quality of a reduction of its P.M product, compared with the resistive magnet systems known up to date, M being the mass of the conductor used for producing-the magnetic field and P being the electric power consumed.

SUMMARY OF THE INVENTION

To this end, the invention provides a sol enoidal magnet, particularly for NMR applications, of the type comprising an arrangement of coils disposed along a common longitudinal axis, symmetrically with respect to a median transverse plane of a zone of interest where the magnetic field reigns, wherein all the coils have substantially the same inner and outer diameter and are connected so as to have the same current passing therethrough and the length of such coils, the distances which separate them axially and their outer diameter being determined so as to give to said field a prescribed homogeneity in said zone of interest with an optmized P.M product.

In fact, no magnet with coils spaced apart over a sphere or other convex surface of revolution can be optimum from the point of view of the P.M product. The fact of raising the problem of optimization of this product has led to choosing a cylindrical structure and to searching, among all the possible combinations of coil lengths and spacings between coils, those which provide both the required homogeneity (typically 1 to 10 ppm in a sphere of 50 cm in diameter about the center of symmetry of the magnet) and the optimum P.M product.

Furthermore, the above mentioned article by Garrett is not concerned with practical conditions of constructing the windings. In particular, it is difficult to form coils without defect when it becomes necessary to superimpose several layers of turns. Such defects affect the homogeneity of the field so that the practical results are often fairly far removed from the theoretical calculations. It is therefore often necessary to compensate experimentally for these defects by adjusting currents in independent correction windings of the coils. These adjustments are laborious and require additional power supplies adjustable independently of each other. In addition, the need to cool the magnet so as to maintain it at a desired operating temperature involves consequently studying the geometry and the dimensions of the coils and possibly associating them with cooling means.

The invention further provides a solenoid magnet of the above defined type having th following additional qualities:

efficient cooling avoiding any drifting;

a coil structure avoiding as much as possible the defects for eliminating or at least considerably simplifying the corrections.

These problems are solved by the fact that said coils are Bitter coils.

By Bitter coil is meant any structure formed from metal annular disks (made typically from copper or aluminium) defining turns, these turns being connected end to end so as to form a solenoid, whereas the disks are stacked with interpositioning of insulators and holes are formed in the disks for defining channels, extending substantially parallel to the longitudinal axis of the coil thus formed, in which a cooling fluid flows. A structure corresponding to the above definition has been described once by F. Bitter in an article in "Review of scientific instruments" December 1936.

Furthermore, the fact of using Bitter coils all having the same inner and outer diameter (which corresponds to an optimization condition of the P.M product) considerably simplifies the technical construction of the magnet considering the nature of the cooling means "at the heart" of this type of coil, since under these conditions the cooling circuits of all the coils can be connected together by coaxial annular passages, formed for example by a succession of double tubular shells inserted between the coils.

The invention also relates to any NMR image formation installation incorporating the above described magnet and in particular any installation of this kind in which the gradient coil system is arranged outside the coils of the magnet.

BRIEF DESCRIPTION OF THE DRAWINGS

The invention will be well understood from the following description of a magnet coiled in accordance with this principle, of the process for calculating the structural characteristics of this magnet and an NMR image formation installation incorporating such a magnet, given solely by way of example, with reference to the accompanying drawings in which.

DESCRIPTION OF THE PREFERRED EMBODIMENT

A solenoid magnet of the invention, such as shown, includes several coils, which are in the example described Bitter coils in accordance with the above definition, disposed along a common longitudinal axis Oz symmetrically with respect to a median transverse plane $P_0$ of a zone of interest 11 in which the magnetic field reigns, this zone of interest being the one where the patient is placed in the case of an application to an NMR image forming installation. The number n of coils may be even or uneven. The length and the position of the ith coil from the center of symmetry O are entirely defined by the pair of distances (b'i, bi) defining respectively the distance with respect to O of its axial end the closest to the center of symmetry O and the distance with respect to O of its axial end the furthest away from the center O. Because of the symmetry with respect to the median transverse plane $P_0$, we have $n = 2q$ if n is even and $b'_1 \neq 0$ $n = 2q-1$ if n is uneven and $b'_1 = 0$ In this latter case, the magne would comprise a central Bitter coil.

The example shown is that where $n=6$, that is to say $q=3$ with three pairs of coils $13a$–$13b$, $14a$–$14b$, $15a$–$15b$, symmetrical with respect to the plane $P_o$. According to an important characteristic of the invention, all the coils are chosen with the same inner radius $a_1$ and the same outer radius $a_2$. This has two essential advantages. It is on the one hand a configuration which allows the product P.M to be optimized and, on the other, it is that which allows the technological construction of the magnet to be simplifed as much as possible, particularly in so far (when it is a question of Bitter coils) as the structure of the cooling fluid flow circuit through the coils is concerned. In this case, the coils, axially aligned and of the same external and internal diameters may be connected to each other by coaxial cylindrical tubular sections $20a$–$20b$, having diameters close to the internal and external diameters of said coils, so as to provide continuity of the cooling fluid circuit in the magnet. On the other hand, all the coils have the same current passing therethrough, they are connected in series.

Figure 1:
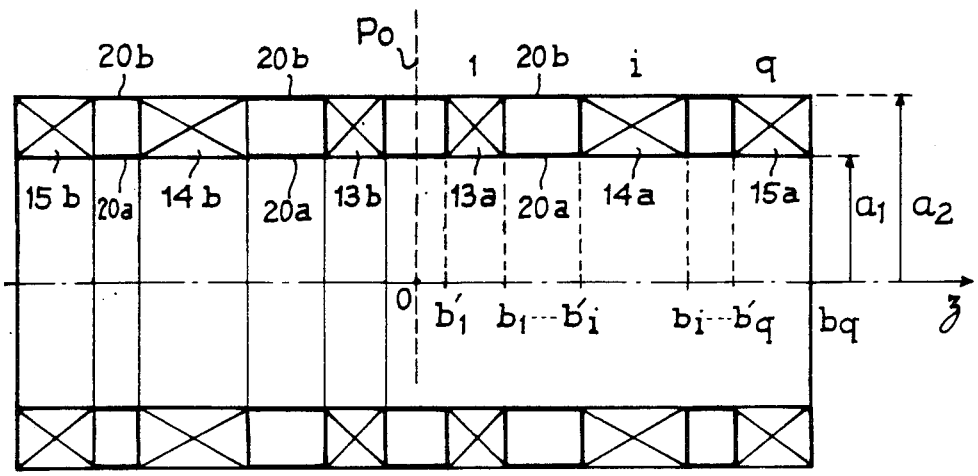
FIG. 1 shows schematically a magnet coiled in accordance with the invention.
Figure 2:
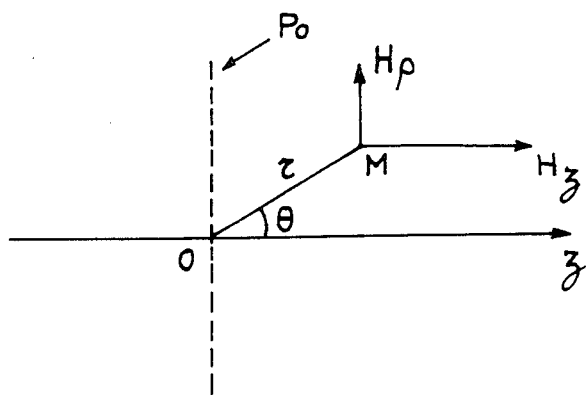
FIG. 2 illustrates the vectorial breakdown of a magnetic field created by a system of currents with symmetry of revolution about an axis Oz with a plane of symmetry perpendicular to Oz at O.

The way to determine certain parameters will now be described: bi, b'i, a2, the section of the turns of the described: $b_i$, $b'_i$, $a_2$, the section of the turns of the them: $a_1$,n M or P so as to obtain a magnetic field of required uniformity (1 to 10 ppm) in a sufficient volume of the zone of the interest 11 about the center of symmetry O. If we consider FIG. 2, it is known that the field created at a point M by a system of currents with symmetry of revolution about the axis Oz with a plane of symmetry $P_0$ perpendicular to Oz at O, may be expressed by its longitudinal $H_z$ and radial $H_p$ components inthe following way:

$$H_z = H_0 + \sum_{p=1}^{\infty} H_{2p} \left(\frac{r}{r_0}\right)^{2p} P_{2p}(\cos\theta)$$

$$H_p = -\sum_{p=1}^{\infty} \frac{1}{2p+1} H_{2p} \left(\frac{r}{r_0}\right)^{2p} P^1_{2p}(\cos\theta)$$

where $P_{2p}$ is Legendre's polynomial of order 2p and $P^1_{2p}$ the associated Legendre polynomial of the same order. Furthermore, r is the distance OM and $\theta$ the angle between OM and Oz. This development is valid inside a sphere of radii $r_{max}$, where $r_{max}$ is the distance to O from the nearest point O where current effectively flows (in other words $r_{max} = a_1$ in the example described) and $r_0$ is any reference length, for example the radius of the sphere of interest in which it is desired to obtain an homogeneous field.

The coefficients $H_{2P}$ have the dimension of the field and characterize the homogeneity of the magnet. To homogeneize the field to a certain order $2p_0$ is tantamount then to cancelling out all the coefficients $H_2$, $H_4$ ... $H_{2P0}$. It is then said that the field is homogeneous up to the order $2p_0$, namely:

$$H_z \neq H_0$$

$$H \neq 0$$

The residual inhomogeneity depends essentially on the values of the terms of order greater than $2_{p0}$. Consequently, the greater the success in cancelling out terms $H_{2P}$ the greater the homogeneity of the field. It can be demonstrated that for a magnet with n coils, there exists no solution cancelling out the $H_2, H_4 \ldots H_{2p0}$ if $p \geq n$.

This is why, for applications to NMR image formation a magnet having six or seven Bitter coils may be calculated for delivering a field having the required homogeneity.

For calculating the characteristics of the magnet $H_0$ and the $H_{2P}$ must be expressed as a function of the structural parameters of the magnet, that is to say the $b_i$ and the $b'_i$, $a_1$ and $a_2$ by taking into consideration the particular expression of the current density rotating about Oz which, for a Bitter coil is of a form $$j_i \frac{a_I}{\rho}$$

where $\rho$ is the distance from a point considered of a Bitter disk to the axis Oz and $J_1$ the maximum current density (on the cylinder of radius $a_1$). Thus, we have:

$$H_0 = \sum_{i=1}^{9} j_i a_1 \left[ \text{Log} \frac{\frac{b_i}{a_1} + \sqrt{1 + \left(\frac{b_i}{a_1}\right)^2}}{\frac{b_i}{a_2} + \sqrt{1 + \left(\frac{b_i}{a_2}\right)^2}} - \text{Log} \frac{\frac{b'_i}{a_1} + \sqrt{1 + \left(\frac{b'_i}{a_1}\right)^2}}{\frac{b'_i}{a_2} + \sqrt{1 + \left(\frac{b'_i}{a_2}\right)^2}} \right]$$

$$H_{2p} = \frac{1}{2p} a_1 r_0^{2p} \sum_{i=1}^{9} j_i \left[ \frac{P_{2p-1}\left(\frac{b_i}{\sqrt{a_2^2 + b_i^2}}\right)}{(a_2^2 + b_i^2)^p} - \right.$$

$$\frac{P_{2p-1}\left(\frac{b_i}{\sqrt{a_1^2 + b_i^2}}\right)}{(a_1^2 + b_i^2)^p} - \frac{P_{2p-1}\left(\frac{b'_i}{\sqrt{a_2^2 + b_i'^2}}\right)}{(a_2^2 + b_i'^2)^p} +$$

$$\left. \frac{P_{2p-1}\left(\frac{b'_i}{\sqrt{a_1^2 + b_i'^2}}\right)}{(a_1^2 + b_i'^2)^p} \right]$$

where $P_{2p-1}(x)$ is the order $2p-1$ Legendre polynomial in xs (x: mute variable).

On the other hand, the conductor mass M is expressed:

$$M = 2\pi m(a_2^2 - a_1^2) \sum_{i=1}^{9} (b_i - b'_i)$$

where m is the voluminal mass of the material whereas the power dissipated by the magnet is:

$$P = 4\pi \rho_0 a_1^2 \text{Log} \frac{a_2}{a_1} \sum_{i=1}^{9} j_i^2 (b_i - b'_i)$$

where $\rho_o$ is the resistivity of the conductor used.

All these expressions are given in units of the international system, that is to say that the lengths are expressed in meters, the current density $j_i$ in amps per square meter and $H_0$ in amps per meter. The magnetic induction field $B_0$ is expressed in tesla with $$B_0 = \mu_0 H_0 \text{ and } \mu_0 = 4\pi 10^{-7}$$

According to the invention, some parameters are determined which are dictated by the needs of the user. The following for example are chosen:

$a_1$ related to the desired access,
$H_0$ related to the desired magnetic induction field,
n: the number of Bitter coils,
$2_{p0}$ the desired homogeneity order.

Furthermore the mass M (or the power P) is chosen.

The other parameters representative of the desired magnet (namely $b_i$, $b'_i$, $j_i$, $a_2$) may then be determined by searching for the minimum of a function of these variables, in this case the power P (or the mass M, respectively) with the following restrictions:

values $H_0$, M, $a_1$, n
$H_{2p} = 0 \, \forall 1 \leq p \leq P0$

The values of the variables giving the minimum of the function P while complying with these restrictions determine the dimensional characteristics of the desired optimum magnet. The problem of minimizing a non linear function of several variables with restrictions is known and perfectly resolved by iterative calculations using a computer. Programs called "routines" capable of carrying out such minimization procedures are available in most "libraries" associated with a scientific computing center The "routine" EO4UAF may be used coming from the "Numerical Algorithms group" library of British origin.

Programming the above expressed analytic expressions of $H_0$, $H_{2p}$, M and P for implementing the "routine" is within the scope of a man skilled in the art.

An additional verification calculation for then calculating the non zero $H_{2p}(P>P0)$ with the values of the parameters determined by the above described calculation allows the theoretical homogeneity of the magnet to be known in any sphere of radius less than $a_1$.

The procedure for optimization calculation may further include several variants. It is in fact possible to minimize other functions than the power P of the mass M, such for example as the first non zero $H_{2p}$, namely $H_2(P0+1)$ or any other function of the non zero $H_{2p}$. Finally a function representative of power P and of one or more non zero $H_{2p}(p>P0)$ may be minimized.

Finally, it should be noted that although the results of the calculation of the magnet give current densities $j_i$ for each Bitter coil (these current density values being representative of the thicknesses of the turns to be used in the different coils since said coils are connected in series), these values appearing in the result vary little so that it is possible to impose as additional restriction that $j_i = j_1 \; \forall \; i$. The characteristics of the optimum magnet will be very little different. On the other hand, the result will be of great technological simplification since all the Bitter coils forming the magnet will be formed from annular disks of the same thickness.

Figure 3:
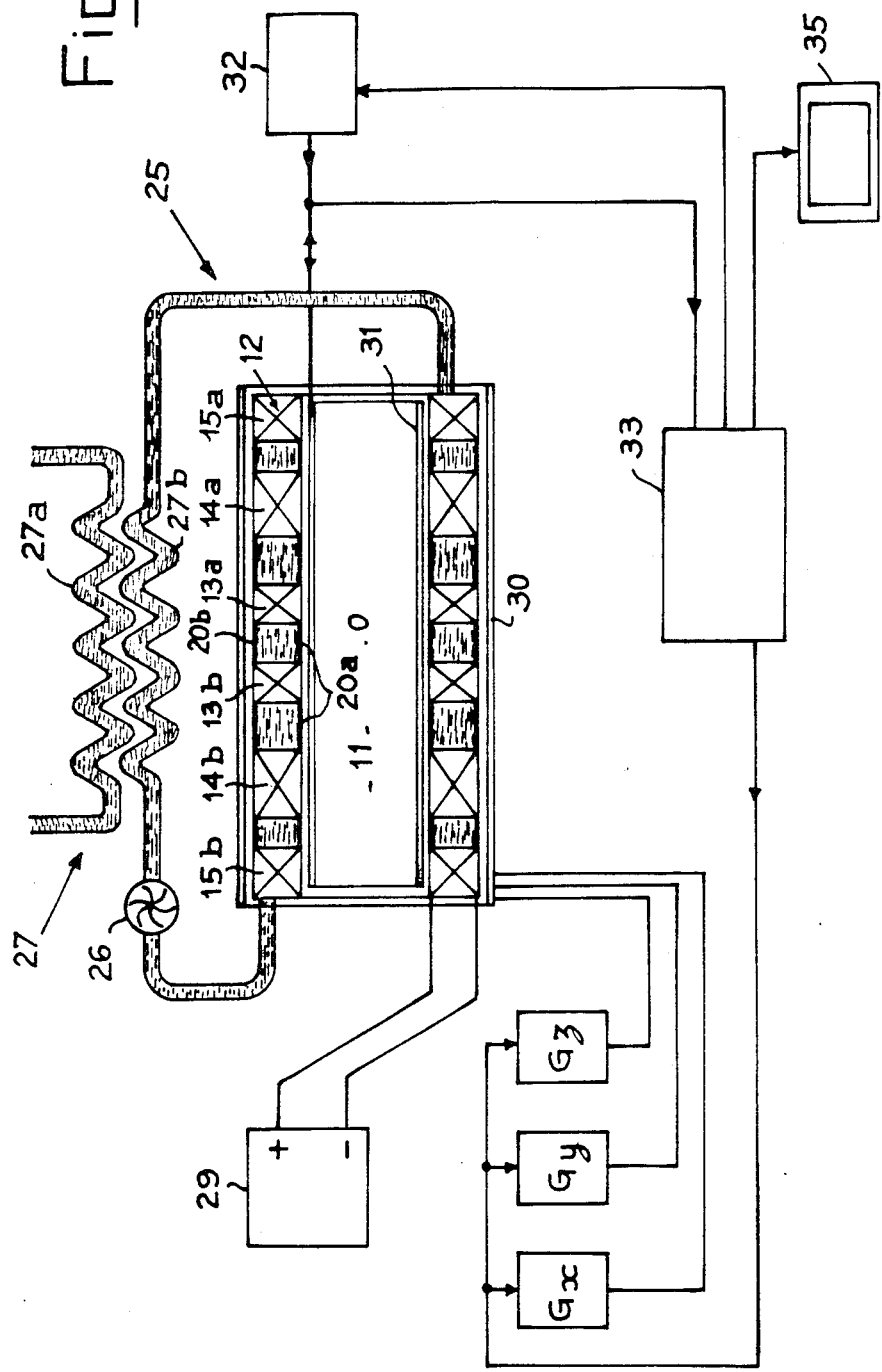
FIG. 3 illustrates schematically an NMR image forming installation incorporating the magnet of FIG. 1.

FIG. 3 illustrates schematically an NMR imageforming installation incorporating a magnet 12 having Bitter coils in accordance with the preceding description.

The magnet comprises the six above mentioned Bitter coils 13a-13b, 14a-14b, 15a-15b connected in series. The spaces between the coils, defined by the tubular sections 20a-20b are filled with the fluid of a cooling fluid flow circuit 25 further including a pump 26 and the secondary circuit 27b of the exchanger 27; the primary circuit 27a of the exchanger has another colder fluid passing therethrough. The Bitter coils have a DC current flowing therethrough delivered by an electric power supply 29. The installation also includes a correction coil system (called shims), known per se and not shown, essentially for offsetting the disturbing effects of the environment on the magnet. The installation is completed by a gradient coil system 30, known per se, by a radio frequency antenna system 31 housed inside the zone of interest 11, of the magnet, by a radio frequency generator 32 and by a computer 33. The gradient coils are connected to a set of DC power supplies Gx, Gy and Gz which are controlled by a cycle of sequences programmed in the computer 33 for supplying the gradient coils with power so as to superimpose on the basic field, generated by the magnet field gradients of different predetermined intensities and orientations during said sequences. It is known that these gradients allow, among other things, the sectional plane of which it is desired to reconstruct the image to be selected. The radio frequency generator 32, connected to the antenna system 31, is also driven by the computer 33 for generating calibrated radio frequency signal pulses during said sequences. The NMR signal retransmitted by the subject during examination are picked up by the same antenna system and used by a computing unit of computer 33, applying known algorithms for reconstituting an image. This image is for example displayed on a cathode ray tube of a television receiver 35. In the prior technique the gradient coils, arranged on a cylindrical mandrel, were placed inside the zone of interest 11 which force constructors to dimension the magnet accordingly (choice of minimum axis $a_1$) so that a sufficient place was left for receiving the patient. The optimization of the product P.M results in such an important reduction of the size of the magnet (in particular if Bitter coils are used) that it becomes possible to place the gradient coil system 30 outside the magnet 12, as is shown in FIG. 3. The coupling between the gradient coils and the Bitter coils of the magnet is further extremely small because of the "leaved" structure of the Bitter coils, perpendicularly to the longitudinal axis of the magnet. It should be noted that the factor placing the gradient coil system 30 inside magnet 12 allows this latter to be calculated by choosing a smaller parameter $a_1$, which results, all other things being equal, in a lower product P.M. That is to say an additional reduction of the mass (and so of the space requirement) of the magnet 12.

Furthermore, it should be noted that the Bitter coils such as they have been effectively fabricated up to present were especially intended for creating intense magnetic fields, for applications where the homogeneity of the field is less important. In this sense, the structure proposed by Bitter could not be considered by a man skilled in the art as a means for readily obtaining an homogeneous field.

In particular, the best known method of connecting the turns (using a pressure contact of the flat faces of the adjacent disks through a cut out in the insulator) has been recognized as one of the causes of intrinsic inhomogeneity of the Bitter magnets constructed up to now, this structural feature not being taken into account in the equations. This is why it is desirable to modify this generally used structure, for example by forming groove and tongue joints at the ends of the radial cut outs of the disks and by welding these ends. The tie rods for assembling together the rings forming a Bitter coil may also be advantageously used for bringing the current to an axial end of the coil. All these improvements which are described in other patent applications filed by the applicant improve the intrinsic qualities of the Bitter structure from the point of view of homogeneity of the field produced.

What is claimed is:

1. A solenoidal magnet, particularly for NMR applications, of the type including an assembly of Bitter type coils disposed along a common longitudinal axis and symmetrically with respect to a median transverse plane of a zone of interest where the magnetic field reigns, wherein all the coils have substantially the same inner and outer diameter and are connected so as to have the same current flowing therethrough and the lengths of the coils, the distances which separate them axially and their outer diameter are determined so as to give to said field a prescribed homogeneity in said zone of interest with an optimized Power-Mass product.

2. The magnet as claimed in claim 1, wherein the disks of all said Bitter coils all have substantially the same thickness.

3. An NMR image forming installation including more especially a solenoid magnet for creating a basic field and a gradient coil system, said magnet being formed of an assembly of Bitter type coils disposed along a common longitudinal axis and symmetrically with respect to a median transverse plane of a zone of interest where the magnetic field reigns, wherein said coils have substantially the same inner and outer diameter and are connected so as to have the same current passing therethrough, the length of said coils and the distance which separate them axially and their outer diameter are determined so as to give to said field a prescribed homogeneity in said zone of interest with an optimized power-mass product and said gradient coil system is arranged outside said coils of said magnet.

* * * * *